United States Patent
Bloom et al.

[11] Patent Number: 5,977,863
[45] Date of Patent: Nov. 2, 1999

[54] LOW CROSS TALK BALL GRID ARRAY RESISTOR NETWORK

[75] Inventors: Terry R. Bloom, Middlebury; Richard O. Cooper, Bluffton; David L. Poole, Portland, all of Ind.

[73] Assignee: CTS Corporation, Elkhart, Ind.

[21] Appl. No.: 09/132,081

[22] Filed: Aug. 10, 1998

[51] Int. Cl.⁶ .................................................. H01C 1/01
[52] U.S. Cl. ........................ 338/320; 338/260; 338/324; 338/325
[58] Field of Search .................................. 338/320, 324, 338/325, 327, 329, 309, 260, 239

[56] References Cited

U.S. PATENT DOCUMENTS

| | | |
|---|---|---|
| 4,300,115 | 11/1981 | Ansell et al. . |
| 4,332,341 | 6/1982 | Minetti . |
| 4,654,628 | 3/1987 | Takayanagi . |
| 4,658,234 | 4/1987 | Takayanagi . |
| 4,945,399 | 7/1990 | Brown et al. . |
| 5,216,404 | 6/1993 | Nagai et al. . |
| 5,379,190 | 1/1995 | Hanamura et al. . |
| 5,539,186 | 7/1996 | Abrami et al. . |
| 5,557,502 | 9/1996 | Banerjee et al. . |
| 5,621,691 | 4/1997 | Seffernick et al. . |
| 5,661,450 | 8/1997 | Davidson . |

*Primary Examiner*—Michael L. Gellner
*Assistant Examiner*—Richard Lee
*Attorney, Agent, or Firm*—Mark P. Bourgeois

[57] ABSTRACT

A resistor network for terminating active electronic devices has low cross talk noise between the adjoining resistors and the conductors that connect the resistors to other electronic packages. A substrate has a top and a bottom surface. Resistors are located on the top surface. Conductors are also located on the top surface and are electrically connected to each end of the resistors. Vias extend through the substrate and electrically connect to the conductors. Solder spheres are positioned on the bottom surface and are electrically connected to the vias. An end of each of the resistors is electrically connected in common through a common conductor. The commoned resistors are electrically connected to a common via through the common conductor. The resistor network minimizes cross talk noise between the resistors and provides a high density interconnection.

6 Claims, 2 Drawing Sheets

LOW CROSS TALK BALL GRID ARRAY RESISTOR NETWORK

BACKGROUND OF THE PREFERRED EMBODIMENT(S)

1. Field of the Preferred Embodiment(s)

This invention generally relates to resistors for electronics. Specifically, the invention is a group of impedance matching or terminating resistors mounted in a high density network or array package using spherical solder connections and having low noise characteristics.

2. Description of the Related Art

Resistor networks are commonly used to terminate high speed digital signal lines to minimize unwanted reflections back through the transmission structure which is typically a printed circuit board. In most applications, the terminations are made by placing a resistor with a resistance matching the impedance of the transmission line, at the end of the transmission line. One end of the resistor is connected to a common termination voltage and the other end is connected to the signal line. For these applications a bussed resistor network is a convenient solution, since one end of the termination is common to all signal lines.

The previous resistor network designs including surface mount, SIP and DIP versions have had resistors and conductor arrangements with individual conductor lines running for a length of some distance on the network before being tied to a common point. This is necessitated because all the external off resistor network connections are made at the periphery of the device and a conductor must be run from the periphery of the device to the individual resistor. The lengthy line length causes each resistor/conductor pair to have a higher mutual inductance between adjoining resistor/conductor pairs and leads to significant cross-talk noise being coupled between the resistor/conductor pairs when the resistor network is employed in its typical use as a terminating or impedance matching resistor for simultaneously switching transistors in an electronic device. As the transistor density and speed of semiconductor devices increase, the problem of cross-talk noise causing an erroneous signal becomes more of a problem in all areas of the electronic package and must be taken into consideration when designing electronic packaging. Further, at high frequencies, the high inductance of the common termination lines can cause a high impedance to appear at the end of the transmission line.

Despite the advantages of each type of prior art resistor network, none have been easily or economically manufactured with a high density of interconnects per unit area on a printed circuit board. In particular, providing the electrical connections only on the periphery of the resistor network causes the electrical leads to be tightly spaced on the edge of the device, while the area in the interior of the device is unused for electrical interconnections.

Therefore, there is a current unmet and heretofore long felt need for a resistor network with higher density, low cross-talk noise and improved signal integrity.

DESCRIPTION OF RELATED ART

Examples of patents related to the present invention are as follows, and each patent is herein incorporated by reference for the supporting teachings:

U.S. Pat. No. 4,945,399, is an electronic package with integrated distributed decoupling capacitors.

U.S. Pat. No. 5,557,502, is a ball grid array package.

U.S. Pat. No. 4,300,115, is a mulitlayer via resistor.

U.S. Pat. No. 4,658,234, is a resistor network.

U.S. Pat. No. 5,621,619, is an all ceramic surface mount sip and dip network having spacers and solder barriers.

U.S. Pat. No. 5,379,190, is a chip type composite electronic part and manufacturing method.

U.S. Pat. No. 4,332,341, is a fabrication of circuit packages using solid phase solder bonding.

U.S. Pat. No. 5,539,186, is a temperature controlled multi-layer module.

U.S. Pat. No. 5,216,404, is a SIC thin film thermistor.

U.S. Pat. No. 4,654,628, is a network resistor unit.

U.S. Pat. No. 5,661,450, is a low inductance termination resistor array.

The foregoing patents reflect the state of the art of which the applicant is aware and are tendered with the view toward discharging applicant's acknowledged duty of candor in disclosing information that may be pertinent in the examination of this application. It is respectfully stipulated, however, that none of these patents teach or render obvious, singly or when considered in combination, applicant's claimed invention.

SUMMARY OF THE PREFERRED EMBODIMENT(S)

It is a feature of the invention to provide a resistor network for terminating active electronic devices that has low cross talk noise between the adjoining resistors and the conductors that connect the resistors to other electronic packages. Specifically, there is a substrate, several resistors, conductors, and vias arranged in a configuration to minimize cross-talk noise. Solder spheres are used to connect the resistors to other electronic circuitry such as a printed circuit board.

It is a feature of the invention to provide a low cross talk resistor network. The resistor network includes a substrate having a top and a bottom surface. Several resistors are disposed on the top surface. Several conductors are disposed on the top surface and are electrically connected to each end of the resistors. Several vias extend through the substrate and electrically connect to the conductors. Several solder spheres are disposed on the bottom surface and are electrically connected to the vias. An end of each of the resistors is electrically connected in common through a common conductor. The commoned resistors are electrically connected to a common via through the common conductor. The via is electrically connected to a solder sphere.

It is a feature of the invention to minimize cross talk noise between the resistors.

It is a feature of the invention to provide a cover coat disposed over the conductors and resistors.

It is a feature of the invention to provide the common conductor with a star shape which minimizes inductance of the common conductor.

It is a feature of the invention to provide a common via located near the center of the star shape.

The invention resides not in any one of these features per se, but rather in the particular combination of all of them herein disclosed and claimed and it is distinguished from the prior art in this combination of all of its structures for the functions specified.

There has thus been outlined, rather broadly, the more important features of the invention so that the detailed description thereof that follows may be better understood, and so that the present contribution to the art may be better appreciated. There are, of course, additional features of the invention that will be described hereinafter and which will form the subject matter of the appended claims. Those skilled in the art will appreciate that the preferred embodiment may readily be used as a basis for the designing of other structures, methods and systems for carrying out the several purposes of the present invention. It is important, therefore, that the claims are regarded as including such equivalent constructions since they do not depart from the spirit and scope of the present invention.

It is noted that the drawings of the invention are not to scale. The drawings are merely schematic representations, not intended to portray specific parameters of the invention. The drawings are intended to depict only typical embodiments of the invention, and therefore should not be considered as limiting the scope of the invention. The invention will be described with additional specificity and detail through the accompanying drawings. The description of the invention may contain, for example, such descriptive terms as up, down top, bottom, right or left. These terms are meant to provide a general orientation of the parts of the invention and are not meant to be limiting as to the scope of the invention.

DETAILED DESCRIPTION OF THE PREFERRED EMBODIMENT

Figure 1:
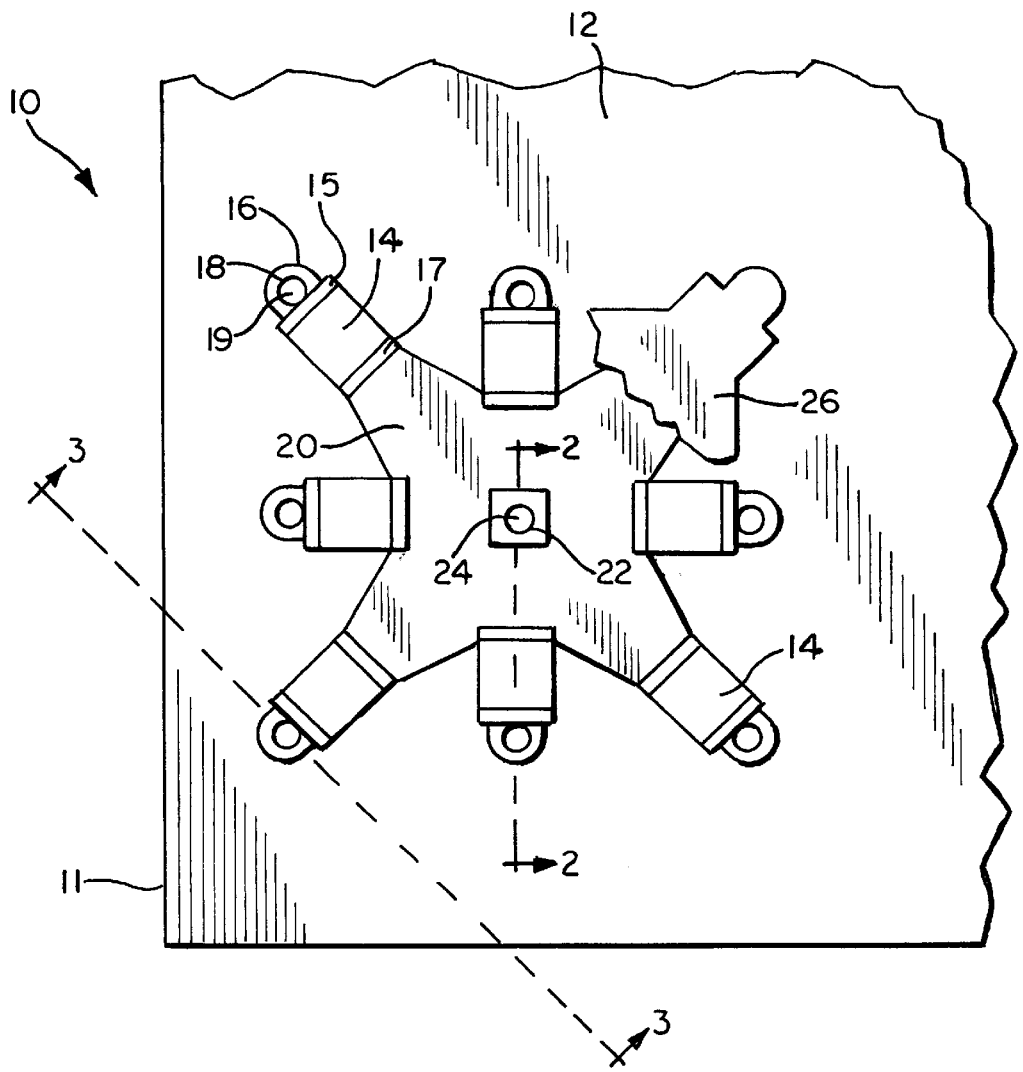
FIG. 1 is a partial top view of the low cross talk ball grid array resistor network with a portion of the cover coat removed.
Figure 2:
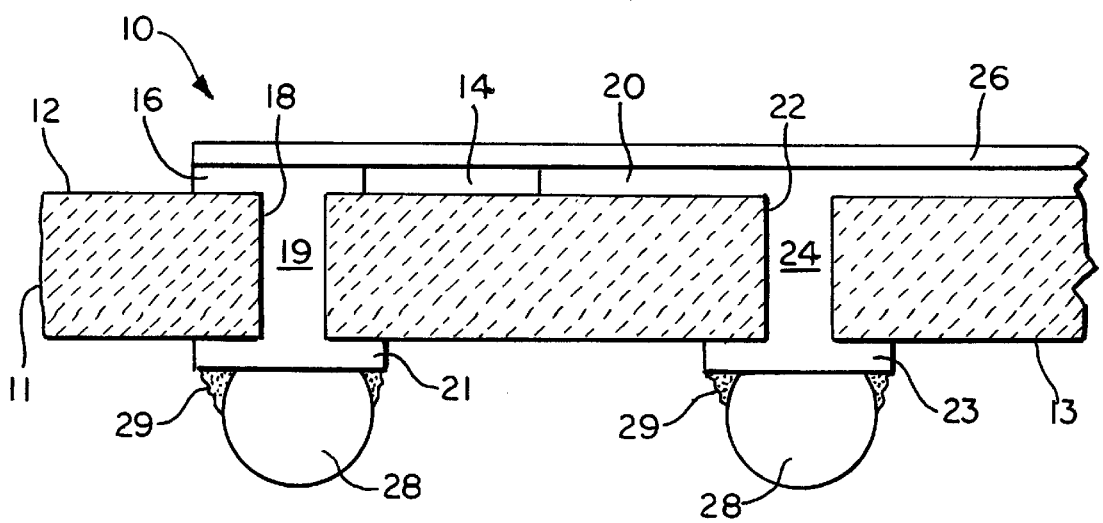
FIG. 2 is a cross-sectional view of FIG. 1 along line 2—2.

Referring to FIGS. 1 and 2, there is a low cross talk noise resistor network assembly 10. In particular, resistor network assembly 10 has a planar substrate 11 having a top surface 12 and a bottom surface 13. The substrate 11 is preferably made out of a ceramic material such as alumina oxide. Resistors 14 are disposed and trimmed on the top surface 12 by conventional thick film resistor processing techniques. Resistors 14 have a first end 15 and a second end 17. Top conductors 16 are disposed on the top surface 12 and bottom conductors 21 and 23 are disposed on the bottom surface 13 by conventional thick film conductor processing techniques. Conductors 16 are electrically connected to the first end 15 of resistors 14. The conductors 16 and resistors 14 slightly overlap and sinter to form a mechanical and electrical bond during processing.

A top common conductor 20 is located on top surface 12 and is electrically connected to the second resistor end 17. A bottom conductor 23 is located on bottom surface 13. The ceramic substrate 11 has cylindrical input vias 18 formed therein and which extend through the substrate 11 and are filled with a conductive via fill 19. Similarly, a cylindrical common via 22 extends through the substrate 11 and is filled with a common conductive via fill 24. The via fill material is a conventional thick film conductor that is screened into the vias and fired. The via fill 19 electrically connects the top and bottom conductors 16 and 21. The common via fill 24 electrically connects the top and bottom common conductors 21 and 23. Solder spheres 28 are mechanically and electrically attached to the bottom conductors 21 and 23. The solder spheres are 10% tin and 90% lead and are commercially available from alpha metals corporation. The solder spheres 28 are attached to the conductors 21 and 23 by a reflowed solder paste 29. The reflowed solder paste is 63% lead and 37% tin which has a low melting point. A terminating voltage is applied to the common via 22 through sphere 28 where the sphere 28 connects to an external electrical circuit such as on a printed circuit board. A cover coat 26 is placed over the resistors, the conductors and the common conductor to protect the resistor network from corrosion and abrasion.

The top common conductor 20 has a star shape and the common via 22 is generally located near the center of the star shape. The top common conductor 23 star shape provides a short common connection to the terminating voltage which is connected to the solder sphere 28 through via 22 and minimizes inductance of the common conductor 23 which minimizes cross talk noise between the resistor/conductor pairs.

Figure 3:
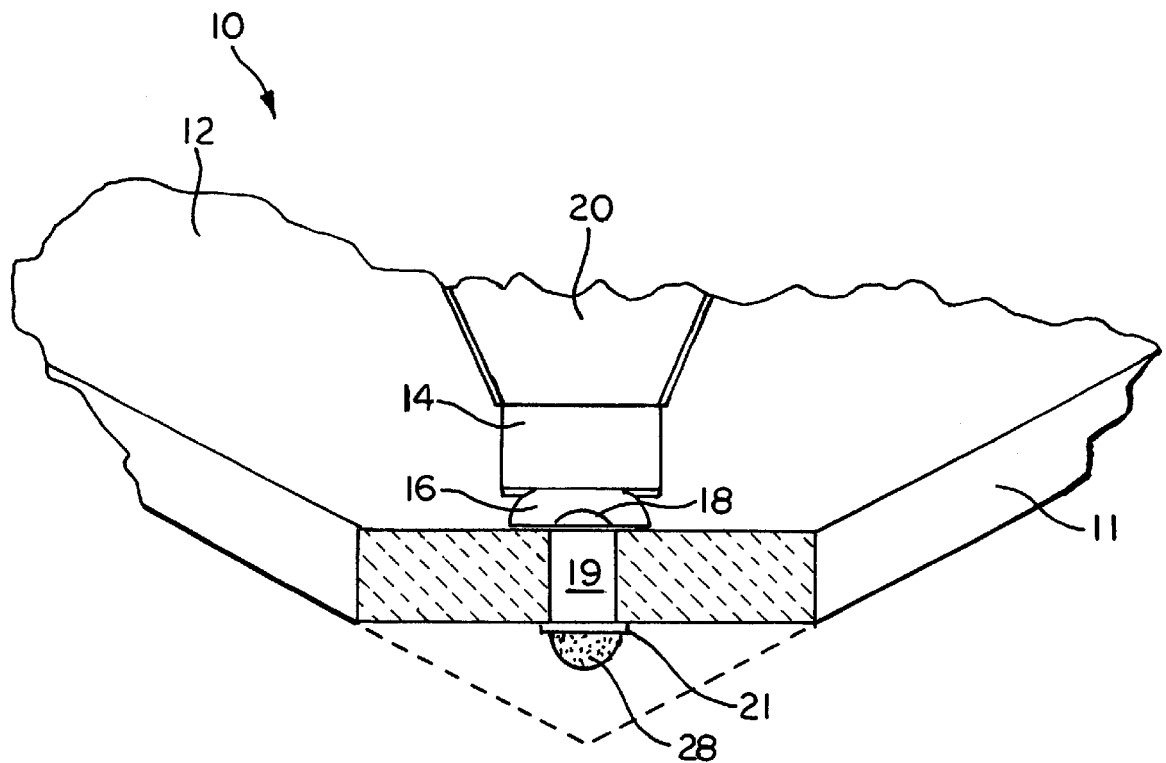
FIG. 3 is a perspective cross-sectional view of FIG. 1 along line 3—3.

FIG. 3 shows a perspective cross-sectional view of FIG. 1 along line 3—3 with the cover coat 26 removed.

Figure 4:
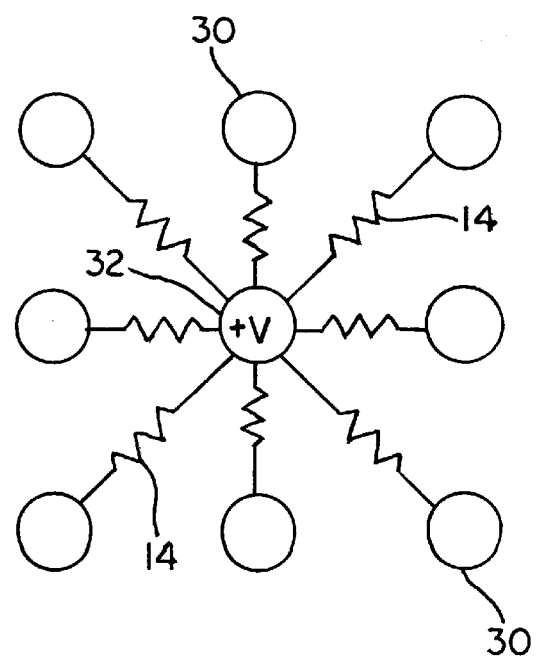
FIG. 4 is an electrical schematic of the resistor network of FIG. 1.

FIG. 4 shows an electrical schematic of the resistor network assembly 10. The resistors 14 are connected through terminals 30 to the individual signal lines that are desired to be terminated. The common terminal 32 is connected to a terminating voltage of magnitude +V. The resistor 14 value is chosen to match the impedance value of the signal line being terminated.

Resistor network assembly 10 is assembled by the following process sequence:
1. Screen via fill 19 and 24 into vias 18 and 22 of substrate 11.
2. Fire in oven.
3. Screen conductors 16 and 20 onto top surface 12.
4. Fire in oven.
5. Screen conductors 21 and 23 onto bottom surface 13.
6. Fire in oven.
7. Screen resistors 14 onto top surface 12.
8. Fire in oven.
9. Laser trim resistors 14 to proper resistance value.
10. Screen and cure cover coat 26.
11. Screen solder paste 29 onto conductors 21 and 23.
12. Place solder spheres 28 onto conductors 21 and 23.
13. Reflow solder paste 29 to bond spheres 28 to conductors 21 and 23.
14. Test assembly 10.

Variations of the Preferred Embodiment(s)

One of ordinary skill in the art of making resistors, will realize that there are many different ways of accomplishing the preferred embodiment. For example, although it is contemplated to make substrate 14 out of ceramic, other suitable materials would work, like polyamide or FR4. These materials would require a different resistor system. Additionally, although only one group of 8 resistors 14 was shown on substrate 11. More or fewer resistors 14 could be tied to common via 22. More than one group of resistor network 10 can be placed on one substrate 11.

It is further possible to have other electrical connections through the substrate other than conductor filled vias, It is possible to use staked copper or metal pins in place of the via fill 19 and 24.

Even though, the specification has shown the common conductor 20 as having a star shape, other shapes are contemplated such as a star with anywhere from 2 to 100 points. The specification showed the common via 22 located near the center of the star shape. It is contemplated to place the common via 22 at other locations such as near the edge of the common conductor 20 or on one of the points of the star shape.

The specification has shown the resistor network assembly 10 with a cover coat 26. It is contemplated, however, to omit the cover coat.

Another variation of the preferred embodiment is to use other types of solder preforms in place of solder spheres 28. For example, solder donuts or wire or squares could be used. Further, the solder could be made from materials other than 10/90 tin lead. For example, a mixture of tin/indium or tin/bismuth could be used if a lower melting solder is desired. A mixture of tin/silver or tin/antimony could be used if a higher temperature solder is desired.

Further, the steps of processing sequence could be modified from that shown in the specification to produce the same end result. For example, the resistors 14 could be placed before the conductors 16 and 20 or the screening of the bottom conductors 21 and 23 could be omitted and the solder spheres 28 reflow soldered directly to the via fill materials 19 and 24.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A resistor network, comprising:
   a) a substrate having a first and a second surface;
   b) a group of resistors, located on the first surface, each resistor having a first end and a second end;
   c) a common via, extending through the substrate, connected to the first end of each resistor, the resistors positioned around the common via;
   d) a plurality of input vias, extending through the substrate, connected to the second end of each resistor;
   e) a common conductor connected between the common via and the first end of each resistor; and
   f) a plurality of solder spheres, located on the second surface, connected to the common via and the input vias.

2. The resistor network according to claim 1, wherein a cover coat is disposed over the first surface.

3. The resistor network according to claim 1, wherein the common conductor has a star shape.

4. A resistor network, comprising:
   a) a substrate having a first and a second surface;
   b) a common via, extending between the first surface and the second surface;
   c) a plurality of input vias, extending between the first surface and the second surface;
   d) a common conductor, located on the first surface and connected to the common via;
   e) a set of resistors, located on the first surface and positioned around the common via, each resistor having a first end connected to the common via and a second end connected to the input vias; and
   f) a plurality of solder spheres, located on the second surface, each solder sphere connected to the common via or the input vias.

5. The resistor network according to claim 4, wherein the common conductor has a star shape.

6. The resistor network according to claim 4, wherein a cover coat is disposed over the resistors, the common conductor, the input vias and the common via.

* * * * *